United States Patent
Nabatame et al.

(10) Patent No.: US 6,483,167 B1
(45) Date of Patent: Nov. 19, 2002

(54) SEMICONDUCTOR DEVICE AND PRODUCTION METHOD THEREOF

(75) Inventors: Toshihide Nabatame, Hitachi (JP); Masaru Kadoshima, Hitachi (JP); Takaaki Suzuki, Hitachinaka (JP); Tetsuo Fujiwara, Hitachinaka (JP); Seiji Watahiki, Hitachinaka (JP); Yasuhiko Murata, Hitachi (JP); Mitsuo Hayashibara, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/644,716

(22) Filed: Aug. 23, 2000

(30) Foreign Application Priority Data

Nov. 30, 1999 (JP) .......................................... 11-339294

(51) Int. Cl.$^7$ .............................................. H01L 29/00
(52) U.S. Cl. ...................... 257/532; 257/295; 257/783; 257/300; 257/301; 257/700
(58) Field of Search ................................ 257/532, 783, 257/300, 310; 438/396, 763

(56) References Cited

U.S. PATENT DOCUMENTS 5,612,574 A * 3/1997 Summerfelt et al. ........ 257/783
5,847,423 A * 12/1998 Yamamichi ................. 257/296
5,976,928 A * 11/1999 Kirlin et al. ................ 438/240
6,281,142 B1 * 8/2001 Basceri et al. .............. 438/771

FOREIGN PATENT DOCUMENTS

JP          11243176          9/1999
JP          11243179          9/1999

* cited by examiner

*Primary Examiner*—David Nelms
*Assistant Examiner*—Thao P Le
(74) *Attorney, Agent, or Firm*—Antonelli, Terry, Stout & Kraus, LLP

(57) ABSTRACT

In a semiconductor device and production method thereof, a technique is used to prevent film separation of the bottom electrode occurring during a heat treatment process which is carried out to make the bottom electrode closely packed and in the heat treatment process for producing dielectric crystallization. In the production method, a glue layer including an insulator is formed between $SiO_2$ insulation layer and the inner wall of a concave hole. The $SiO_2$ layer 14 is located on the Si board 11, and Si plug 12 and a barrier layer 13 are formed therein. A glue layer 16 is formed on the inner wall of the hole of the $SiO_2$ insulation layer 15, and a bottom electrode 17 comprising Ru is formed on the barrier layer 13 and glue layer 16. Dielectric film 18 comprising BST and a top electrode 19 comprising Ru are laminated sequentially on the bottom electrode 17, to form a dielectric device with the bottom electrode 17.

3 Claims, 4 Drawing Sheets

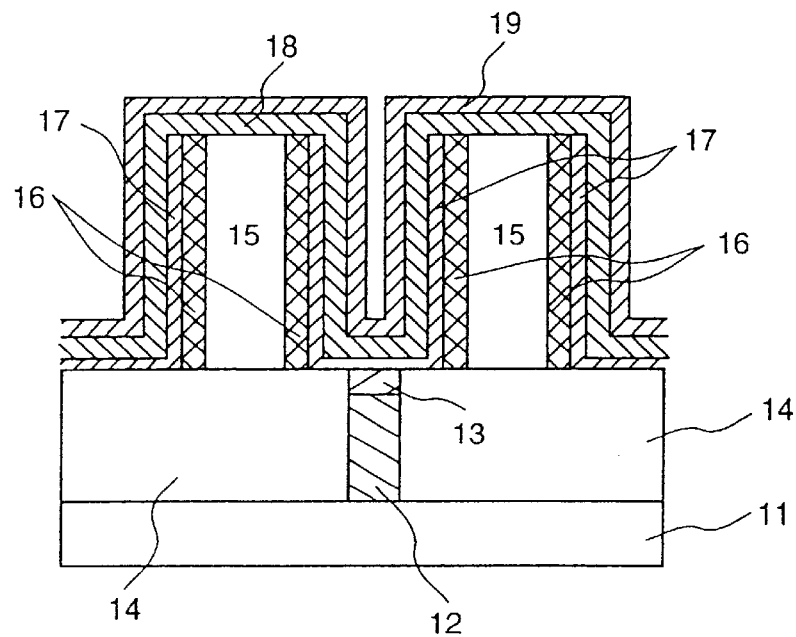
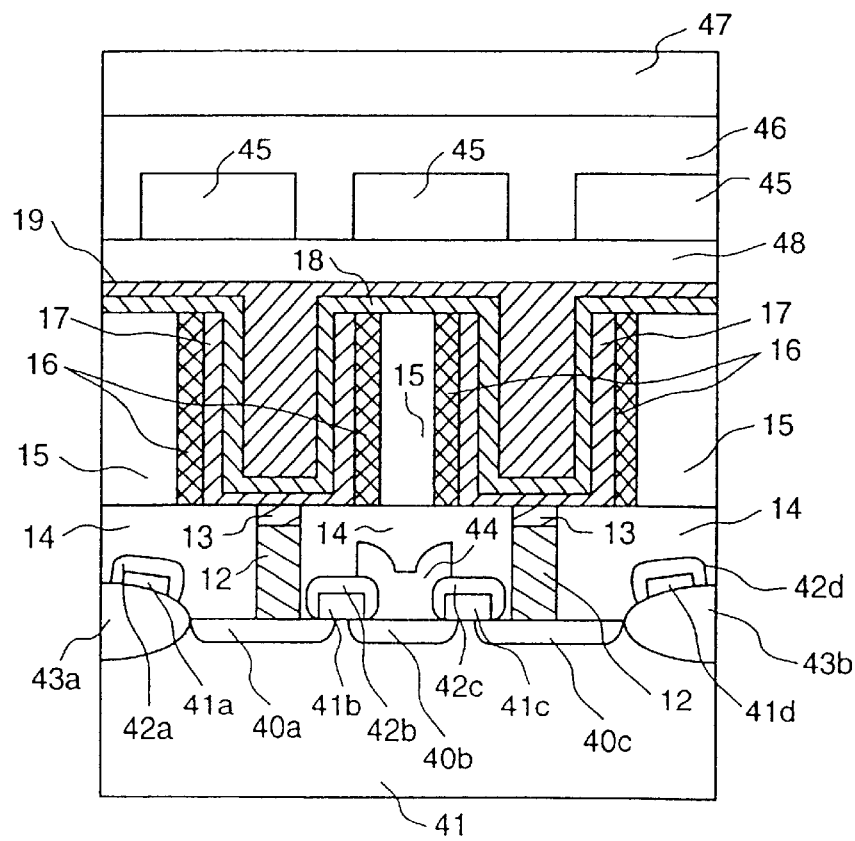

SEMICONDUCTOR DEVICE AND PRODUCTION METHOD THEREOF

BACKGROUND OF THE INVENTION

The present invention relates to a semiconductor device and a method of production thereof; and, more particularly, the invention relates to a semiconductor device having a built-in dielectric device and the method of production thereof.

Since the DRAM (Dynamic Random Access Memory) has a large capacity, attempts are being made to produce its capacitor portion as a microstructure. To produce the capacitor as a microstructure, it is necessary to reduce the dielectric material thickness, to select materials having a high dielectric constant, and to design a three-dimensional structure comprising top/bottom electrodes and dielectrics. The publication Integration Processes of (Ba, Sr)TiO$_3$ capacitor for 1 Gb and Beyond [Byoung Teak Lee et al.; IEEE TECH. Dig., 1998, pp 815–818] describes a capacitor with 3-dimensional structure where a 5 nm conductive TiSiN film is formed as a glue layer between the Pt bottom electrode and the SiO$_2$ substrate. The aspect ratio (depth/width) of the 3-dimensional structure of this capacitor is about 3, and (Ba, Sr) TiO$_3$(BST) is used to produce the dielectric. The BST dielectric film is prepared on the bottom electrode by the CVD (chemical vapor deposition) method.

Japanese Patent Laid-Open No. 243179/1999 discloses a capacitor portion having a flat dielectric and top/bottom electrodes of planer structure where the oxide layer comprising oxide IrO$_2$ or RuO$_2$, and metallic layer comprising Ir or Ru are formed on the SiO$_2$ insulator films.

However, if separation occurs to the bottom electrode on the side wall of the holes in a 3-dimensional structure, a greater stress is caused by film separation since the aspect ratio is greater. This causes separation to more likely occur on the bottom electrode at the bottom, making it difficult to create a 3-dimensional structure.

The publication Integration Processes of (Ba, Sr)TiO$_3$ capacitor for 1 Gb and Beyond [Byoung Teak Lee et al.; IEEE TECH. Dig., 1998, pp 815–818] describes a capacitor where a TiN barrier, a TiSiN glue layer, a Pt bottom electrode and a BST dielectric are sequentially laid out on an Si plug. The Si in the TiSiN glue layer is likely to be oxidized in the process of heat treatment in an oxygen atmosphere, which is carried out after BST film formation, and part of the glue layer becomes a SiO$_2$ insulation film, resulting in poor conduction between the Si plug and Pt bottom electrode in some cases. Furthermore, the TiSiN glue layer and the Pt bottom electrode are produced by the sputtering method. In the case of a 3-dimensional structure having an aspect ratio of more then 3, this results in a poor coverage over level differences, and the deposition on the side wall of the holes is reduced below that on the surface and bottom, thereby presenting a problem in that a 3-dimensional structure cannot be created.

SUMMARY OF THE INVENTION

An object of the present invention is to provide a semiconductor device and a method of production thereof, where means are provided to prevent film separation of the bottom electrode during the heat treatment process carried out to make the bottom electrode closed packed and in the heat treatment process for producing dielectric crystallization.

Another object of the present invention is to provide a highly integrated semiconductor and a method of production thereof, where said semiconductor has a 3-dimensional structure with an aspect ratio greater than 3.

The present invention achieves the foregoing objects by a technique which is characterized by a glue layer containing an insulator provided between the bottom electrode and the inner wall of the convex holes of the insulation layer.

The film of the bottom electrode produced by the CVD method includes residual elements of carbon, hydrogen and oxygen resulting from CVD material. In the heat treatment process which is carried out to make the bottom electrode closely packed and in the heat treatment process for producing dielectric crystallization in an oxygen atmosphere, these residual elements are separated from the film of the bottom electrode, and the oxygen of the residual elements reacts with the metallic element of the bottom electrode, resulting in recrystallization of the bottom electrode and film shrinkage. However, the bonded film allows the bottom electrode film to be heavily bonded to the substrate SiO$_2$, thereby preventing separation of the bottom electrode film from substrate SiO$_2$.

In a device having 3-dimensional structure, the stress causing separation between the bottom electrode film and the substrate SiO$_2$, is produced by shrinkage of bottom electrode film on the side wall of the holes. Especially, in a device having a 3-dimensional structure, where the aspect ratio is 3 or more, a greater force is produced by the bottom electrode film on the side wall of the holes to separate the bottom electrode film at the bottom of the holes from the barrier layer. By the present invention, however, the glue layer on the side wall of the holes alleviates the stress between the bottom electrode film on the side wall of the holes and the substrate SiO$_2$. Even in a device having a 3-dimensional structure with an aspect ratio greater than 3, an effective conduction between the bottom electrode and Si plug is ensured by the present invention, without bottom electrode film on the bottom of the holes being separated from the barrier layer.

The present invention is further characterized by having three processes: a process of forming a glue layer on the inner wall of the holes formed on the insulating film by the CVD (chemical vapor deposition) method, a process of removing the glue layer from the barrier, and a process of forming a bottom electrode on the glue layer.

Use of the CVD (chemical vapor deposition) method allows a homogeneous glue layer to be formed even in a device having a 3-dimensional structure with an aspect ratio greater than 3.

A metallic film containing at least any one of Ti, Ta, W and Cu provided on the inner wall of the holes, formed on the insulating film, such as SiO$_2$, allows this metallic film and the substrate SiO$_2$ to be bonded closely to each other, since Ti, Ta, W and Cu is extremely adhesive with SiO$_2$. Furthermore, this metallic film is oxidized in the bottom electrode forming process, in the heat treatment process which is carried out to make the bottom electrode more closely packed, and in the heat treatment process for producing dielectric film crystallization in an oxygen atmosphere. Therefore, the glue layer containing at least one of Ti, Ta, W and Cu exhibits an excellent adhesion to both the substrate film and the bottom electrode. Even when exposed to impact or external damage in the processing after formation of the bottom electrode on the glue layer, separation on these interfaces is prevented by excellent adhesion of the glue layer with the insulating film and bottom electrode.

The glue layer, comprising a metallic oxide film, is formed by oxidizing the metallic film containing at least one of Ti, Ta, W and Cu. Not only that, a metallic film can be created using the metal containing at least one of Ti, Ta, W and Cu and another metal which does not easily oxidize, and a bonded film resulting from a mixture of metallic oxide and metal can be formed by oxidizing this film. Through formation of a metallic oxide in the glue layer, both types of bonded film alleviate the stress between the Ru film and the substrate $SiO_2$ resulting from recrystallization of the Ru film and film shrinkage.

This glue layer is first formed by metal. Metallic film has a large degree of freedom in etching conditions, and substantially reduces the etching speed of an insulating film, such as $SiO_2$ and barrier layer, permitting selective etching of the metallic film. Therefore, the glue layer can be formed only on the inner wall of the holes by etching prior to the glue layer being oxidized. If the film formed of a compound comprising $ARuO_3$ (A=Ba, Sr) or amorphous film including the constitute elements is used in the glue layer, the Ru metal or $RuO_2$ oxide of the bottom electrode and $ARuO_3$ share the Ru constituent element, thereby ensuring excellent adhesion. Furthermore, an alkaline earth metal (Ba and Sr) in the glue layer easily diffuses into $SiO_2$; this ensures excellent adhesion with the film of compound comprising the substrate $SiO_2$ and $ARuO_3$ or amorphous film containing the constituent element $ARuO_3$. Therefore, the compound comprising $ARuO_3$ (A=Ba, Sr) or the glue layer containing the amorphous material including the constituent element exhibits an excellent adhesion with both the substrate insulating film and the bottom electrode.

In order for the glue layer to be effective as a film, the film thickness is required to be 10 nm or more, but the film surface becomes roughened if the thickness exceeds 50 nm. So film thickness is preferred to be 10 nm or more, and 50 nm or less.

The present invention has produced a semiconductor device having a high aspect ratio where separation of the bottom electrode does not occur in the heat treatment of the bottom electrode or heat treatment for crystallization of the dielectric film in oxygen atmosphere.

The insulation layer itself may be formed of the same material as that of the glue layer and a bottom electrode may be formed directly on the inner wall of the hole after forming a hole in the insulation layer.

BRIEF DESCRIPTION OF THE DRAWINGS

In the accompanying drawings,

FIG. 1 is a cross sectional view representing an example of the dielectric device according to the present invention;

FIG. 3 is a cross sectional view of a DRAM cell formed as a semiconductor device representing one embodiment of the present invention;

DESCRIPTION OF THE PREFERRED EMBODIMENTS

Figure 2A:
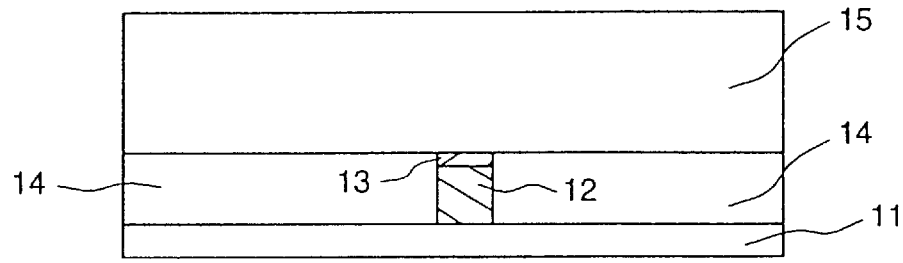
FIGS. 2(a) to 2(h) are a sequence of diagrams representing the production process of the semiconductor device according to the present invention.

Excellent adhesion between Ti/Ta/W/Cu metals and $SiO_2$ is widely known. However, adhesion between a thin film comprising Ru, $RuO_2$ or a combination of the two and Ti/Ta/W/Cu metals has not yet been very clear.

After forming a thin film of Ti/Ta/W/Cu metal on the substrate where the $SiO_2$ insulation layer is formed on the Si substrate, the inventors of the present invention have produced a thin film comprising Ru, $RuO_2$, or a combination of the two by the MOCVD method using the cyclopentadienyl complex. They provided heat treatment in an oxygen atmosphere and examined the adhesion between the Ti/Tao W/Cu metals, the Ru film and the $SiO_2$ insulation layer.

As a result of this experiment, the present inventors have found that there is an improvement in the adhesion between the oxide of the Ti/Ta/W/Cu metal, Ru and $SiO_2$. Oxygen used as a reaction gas in the MOCVD method is dissolved in a Ru film, and the oxide of the Ti/Ta/W/Cu metal is produced by oxidation of the Ti/Ta/W/Cu metal using the heat treatment by oxygen in this Ru film.

The glue layer containing such oxides exhibits an excellent adhesion with both the substrate $SiO_2$ insulation film and the Ru bottom electrode. Thus, it is possible to prevent separation of the bottom electrode in both the heat treatment process which is carried out to make the bottom electrode more closely packed and in the heat treatment process for producing dielectric crystallization in an oxygen atmosphere. The Ru bottom electrode can be manufactured on the inner wall of the holes of the substrate $SiO_2$ in 3-dimensional structure with an aspect ratio greater than 3.

The following describes the configuration of a dielectric element by the present invention with reference to FIG. 1. Numeral 11 in the Figure denotes the Si board where MOS (not illustrated) is formed. A $SiO_2$ layer 14 is located on this Si board 11, and a Si plug 12 and a barrier 13 are formed therein. A glue layer 16 is formed on the inner wall of the holes of the $SiO_2$ insulation layer 15. Bottom electrode 17 comprising Ru is formed on the barrier 13 and glue layer 16. A dielectric film 18 comprising BST and a top electrode 19 comprising RU are laminated sequentially on the bottom electrode 17. A dielectric device is formed by this top electrode 19 and bottom electrode 17.

The following describes how to manufacture the dielectric device shown in FIG. 1.

Figure 2B:
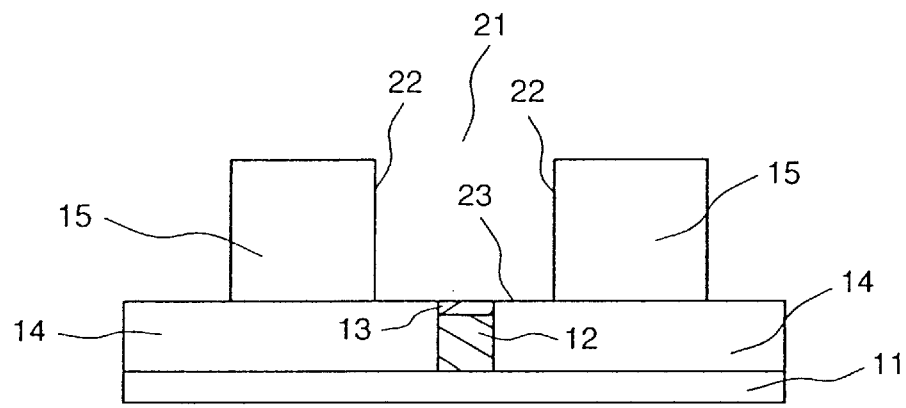

A contact hole is opened on the $SiO_2$ layer 14, which is formed by oxidizing a Si wafer, with the MOS portion being formed by heating it to 300 degrees Celsius. Then Si plug 12 is produced. After that, TiN barrier layer 13 is formed on the Si plug 12 by sputtering. Further, the $SiO_2$ insulation layer 15 is formed by the plasma CVD method using TEOS material (FIG. 2(a)). After that, a groove is machined centering on the contact hole, to produce a substrate with single-sided hole 21 (FIG. 2(b)).

Figure 2C:
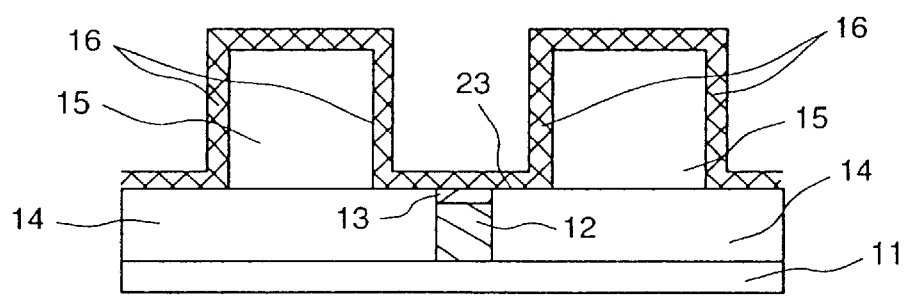

A glue layer 16 is formed on the inner wall of the single-sided hole 21 (FIG. 2(c)). To form a glue layer on the inner wall of the holes of the substrate $Sio_2$ in a highly 3-dimensional structure with an aspect ratio greater than 3, the coverage (side wall film thickness/surface film thickness) is required to be 70% or more. The CVD (chemical vapor deposition) method provides an effective means to meet this requirement.

Figure 2D:
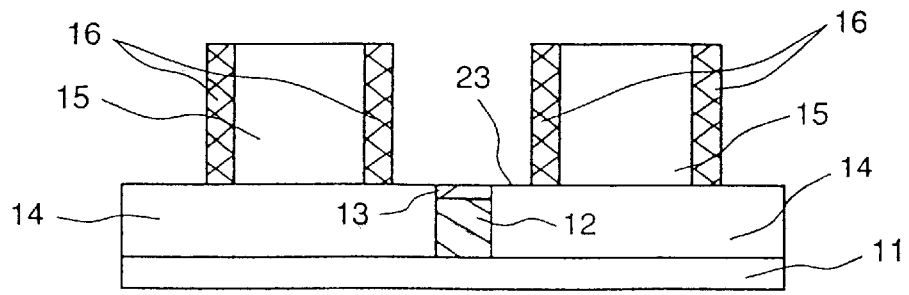

Then, portions of the glue layer are removed by etching from the surface of the $SiO_2$ insulation layer 15 and from the barrier layer 13, thereby forming cylindrical glue layer 16 along the side walls 22 of the holes 21 (FIG. 2(d)).

Figure 2E:
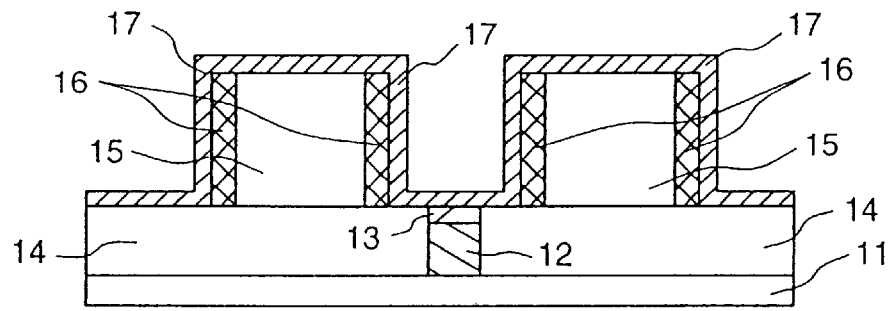
Figure 2F:
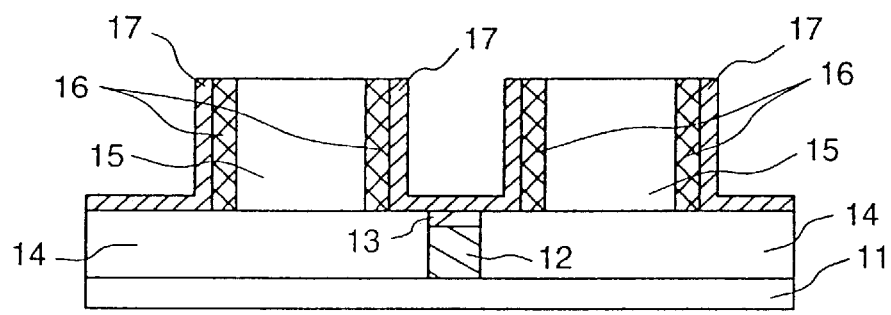

A bottom electrode 17 made of Ru is formed by the reduced pressure CVD method including oxygen (FIG. 2(e)) so as to cover the glue layer 16 on the side walls 22 of the holes 21 and the barrier layer 13 in the bottom wall of the holes 23. Subsequently, a portion of the bottom electrode 17 is removed from the surface by etching, and bottom electrode 17 is produced in a concave form on the inner wall of the holes (FIG. 2(f)). Heat treatment is conducted in an inactive atmosphere, thereby allowing the bottom electrode 17 to be closely packed.

Figure 2G:
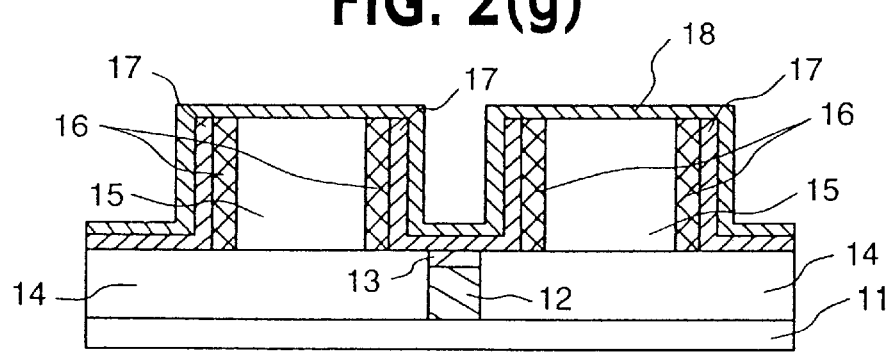

Then, a dielectric film 18 comprising BST is deposited by the reduced pressure CVD method using oxygen (FIG. 2(g)). This is followed by a heat treatment process for producing crystallization in an oxygen atmosphere, thereby oxidizing the glue layer 16 wholly or partly.

Figure 2H:
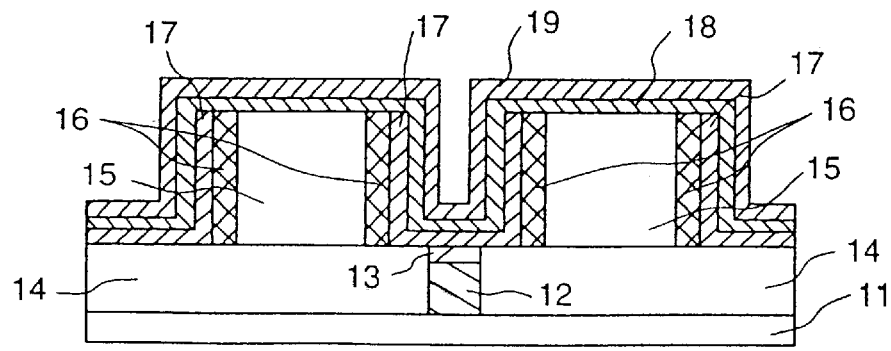

Further, a top electrode 19 made of Ru is deposited on the dielectric film 18 by the reduced pressure CVD method using oxygen (FIG. 2(h)).

Ru is used for bottom electrode 17 in the process discussed above. Without being confined to Ru only, a mixture of Ru and $RuO_2$, or a combination of Ru and another material may be used in place of Ru. Precious metals such as Pt and Ir may be used as materials for the bottom electrode 17. BST is used to produce dielectric film 18 in the above process, but other materials such as $Pb(Zr, Ti)O_3$, $(Pb, La)(Zr, Ti) O_3$, $Ta_2O_5$, $SrBi_2 Ta_2 O_9$, $SrTiO_3$ and $BaTiO_3$ may be used instead of BST.

Ru is used for top electrode 19 in the process discussed above. Without being confined to Ru alone, a mixture of Ru and $RuO_2$, or a combination of Ru and another material may be used in place of Ru. Precious metals such as Pt and Ir may be used as materials for the top electrode 19.

The following specifically describes how to manufacture a dielectric device:

Embodiment 1

The following more particularly describes a method of manufacture where Ta is used for the glue layer. In the cross-sectional view of the dielectric device as shown in FIG. 1, reference numeral 11 denotes the Si board where the MOS portion (not illustrated) is formed.

A contact hole is opened on the $SiO_2$ layer 14 which is formed by oxidation by heating the Si board 11 to 300 degrees Celsius. This is following by the process of creating Si plug 12. Then, a barrier layer 13 in the form of a 10 nm thick layer of TiN is produced on the Si plug by sputtering, and a 800 nm thick $SiO_2$ insulation layer 15 is formed by plasma CVD using TEOS material. A 240 nm-diameter hole is formed centering on the contact hole, thereby creating a substrate with a concave hole. The aspect ratio (hole depth/hole width) of this 3-dimensional structure is about 3.3.

Pentaethoxy tantalum $(Ta(OC_2H_5)_5)$ is fed to this substrate at the rate of 0.1 to 3 SCCM, using a liquid mass flow controller as a CVD material. The vaporizer temperature is set to 100 to 150 degrees Celsius, and the CVD material is vaporized directly from liquid to gas. Then, Ar gas is fed at the rate of 198 to 500 SCCM, and the CVD/Ar gas is mixed with hydrogen gas at the rate of 2 to 100 SCCM; and, it is then introduced into the reactor. The reactor pressure is set to 0.1 to 50 Torr. The film forming temperature is set within the range from 350 degrees Celsius or more to 500 degrees Celsius or less. Film is formed for 1 to 20 minutes to get a Ta film with a film thickness of 10 to 50 nm.

Glue layer 16 is formed on the inner wall of the hole after the Ta film has been removed from the hole surface and the barrier layer 13 by a selective etching process.

Bottom electrode 17 is then produced. To produce it, dis(ethylcyclopentadienyl) ruthenium $(Ru(Et Cp)_2)$ complex is blended with tetrahydrofuran (THF) solvent at a concentration of 0.05 to 0.25 mol/L to get a CVD material. The CVD material is supplied at the rate of 0.1 to 3 SCCM using a liquid mass flow controller. The vaporizer temperature is set to 80 to 150 degrees Celsius, and the CVD material is vaporized directly from liquid to gas. Then, Ar gas is fed at the rate of 198 to 500 SCCM, and the CVD/Ar gas is mixed with oxygen gas at the rate of 2 to 800 SCCM; it is then introduced into the reactor. The reactor pressure is set to 0.1 to 50 Torr. The film forming temperature is set within the range from 180 degrees Celsius or more to 250 degrees Celsius or less. Film is formed for 1 to 20 minutes to get a Ru film with a film thickness of 20 to 30 nm. SOG is then applied by the spin coating method to fill the irregular surface, thereby producing a flat surface. After setting the SOG by heat treatment at 300 degrees Celsius, it is polished by a chemical mechanical polishing method using a phosphoric acid solvent until the surface of the $SiO_2$ insulation layer 15 appears. Then, any SOG remaining in the depressions of Ru film is removed to produce the bottom electrode 17. The Ru bottom electrode 17 is made to be closely packed by heat treatment in a nitrogen atmosphere at 350 to 600 degrees Celsius.

The above process is followed by the process of producing (Ba, Sr) $TiO_3$(BST) as dielectric film 18 on the bottom electrode 17 by the CVD method. Barium bisdipivaloyl methanato (Ba(dpm)2), strontium bisdipivaloyl methanato (Sr(dpm)2) and diisopropoxy titan dipivaloyl methanato (Ti(O-iPr)2(dpm)2) are used as starting materials. Each of them is mixed into the THF solvent at a concentration of 0.05 to 0.25 mol/L to get the CVD material. Each CVD material is supplied at the rate of 0.1 to 3 SCCM by means of a liquid mass flow controller to the vaporizer which is set at 250 degrees Celsius. The CVD material gas is introduced to the reactor with an Ar carrier gas at 200 SCCM, and oxygen gas is also introduced to the reactor at the rate of 5 to 100 SCCM. The reactor pressure is set to 0.1 to 50 Torr., and the film forming temperature is set at 420 degrees Celsius. Film is formed for 3 minutes to get BST thin film 18 with a film thickness of 30 nm.

Then, its crystallizability is improved by heat treatment in an oxygen atmosphere at 650 degrees Celsius for 30 to 60 sec.

Top electrode 19 is then formed on this dielectric film 18. Film is formed using the same method as that used to produce the bottom electrode 17, thereby getting a top electrode 19 of Ru film.

The dielectric "εr" of the device thus obtained at 1V is 300, thereby exhibiting excellent electrical characteristics. Furthermore, an SEM observation of the cross section of the dielectric device has revealed that the Ta glue layer consists of an oxide layer 5 to 30 nm deep from the Ru bottom electrode interface and an oxide/metal mixed layer.

Ta is used in the glue layer in the process discussed above. When Ti, W and Cu or a thin film using said elements as major components is used, dielectric device free from film separation can be formed by using the same method as described above. As in the case of the Ta glue layer, each glue layer of the produced dielectric device has been found to consist of an oxide layer and an oxide/metal mixed layer.

Figure 4:
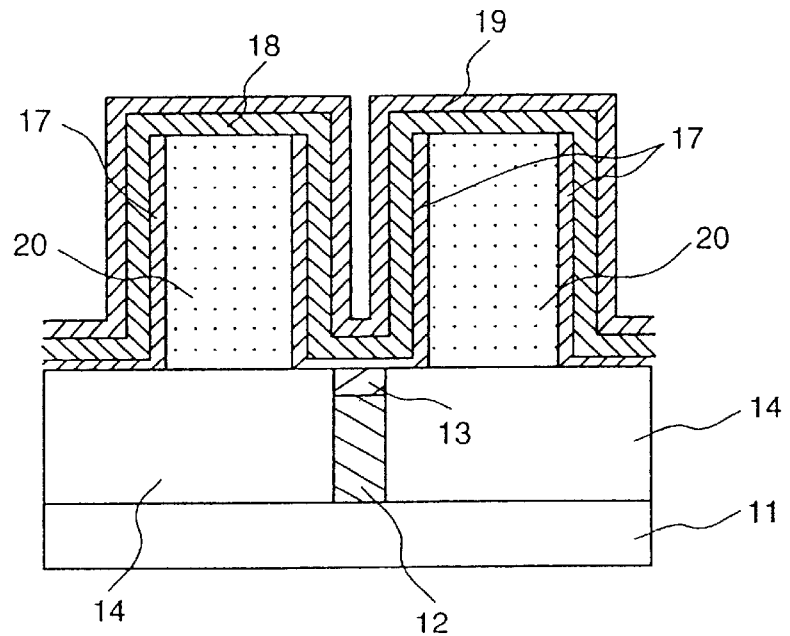
FIG. 4 is a cross-sectional view representing a modification of the dielectric device according to the present invention.
Figure 5A:
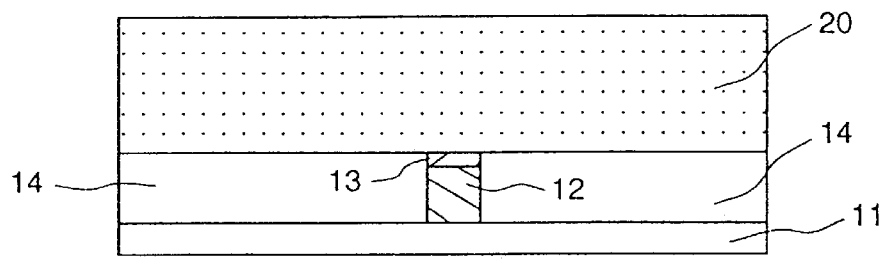
FIGS. 5(a) and 5(b) are diagrams representing a part of the production process of the dielectric device of FIG. 4.
Figure 5B:
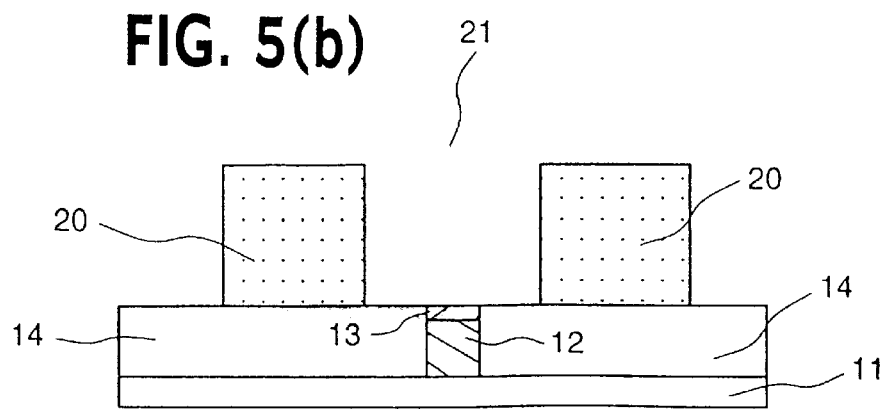

The above discussion is directed to a dielectric element provided with glue layer 16. Here, the $SiO_2$ insulation layer 15 itself may be made of the same material as that of the glue layer 16 (See FIG. 4). A Ta layer 20 having a thickness of 800 nm is formed by sputtering on the Si substrate 11, where the Si plug 12 and barrier layer 13 are formed (FIG. 5(a)). A 240 nm diameter hole is processed on this Ta layer to produce a base substrate having a single sided hole 21 (FIG. 5(b)). The aspect ratio (hole depth/hole width) of this 3-dimensional structure is about 3.3. The subsequent process is similar to the semiconductor production method described with reference to FIGS. 2(e) to 2(h); namely, it contains the process of forming the bottom electrode 17 and top electrode on the Ta layer 20.

Similarly to the case of the dielectric element provided with glue layer 16, the Ta layer 20 is turned into an insulation film of metallic oxide by heat treatment carried out during the process, thereby ensuring excellent adhesion with the bottom electrode 17. Therefore, this dielectric element is also capable of avoiding separation on the boundary between the insulation film and the bottom electrode 17.

This dielectric element production method ensures a shorter production process than the production method of forming a glue layer 16 between the $SiO_2$ insulation film and the bottom electrode 17.

Embodiment 2

The following describes the dielectric device of a second embodiment of the present invention. Similar to the First Embodiment, a 240 nm-diameter hole is formed centering on the contact hole shown in FIG. 2(d), thereby creating a substrate with a concave hole. The aspect ratio (hole death/hole width) of this 3-dimensional structure is about 3.3. Numeral 21 in the drawing denotes a single-sided hole, 22 denotes a side wall of the holes, and 23 denotes a bottom wall of the hole.

Using Sr(dpm)2 and tridipivaloyl methanato ruthenium Ru(dpm)3) as starting materials on this substrate, each is mixed with a THF solvent at the concentration of 0.05 to 0.25 mol/L to get CVD materials. Each CVD material is supplied at the rate of 0.1 to 3 SCCM by means of a liquid mass flow controller to a vaporizer which is set at 200 degrees Celsius. The CVD material gas is introduced to a reactor with an Ar carrier gas at 200 SCCM, and oxygen gas is also introduced to the reactor at the rate of 5 to 100 SCCM. The reactor pressure is set to 0.1 to 50 Torr., and the film forming temperature is set at 420 degrees Celsius. Film is formed for 3 minutes to get a $SrRuO_3$ glue layer 16 with a film thickness of 10 to 50 nm.

Glue layer 16 is formed on the inner wall of the hole after the film has been removed from the hole surface and the barrier layer 13 by a selective etching process.

The same film forming and processing method as that in Embodiment 1 is used to obtain the Ru bottom electrode 17 film with a film thickness of 20 to 30 nm, BST dielectric film 18 thereon, and, lastly, a Ru top electrode, thereby providing a dielectric device.

The "εr" of the dielectric device thus obtained at 1V is 300, thereby exhibiting excellent electrical characteristics. Crystallizability resulting from X-ray diffraction of the $SrRuO_3$ glue layer 16 is poor; and, the specific resistance estimated from the lattice constant calculated from the peak is 500 mΩcm. The film is found to have a very high resistance. Furthermore, an amorphous portion is also found to be contained in the $SrRuO_3$ thin film.

When Ba(dpm)2 or a mixture of the two in place of Sr(dpm)2 is used as a CVD material, it is possible to form a dielectric device free from film separation if the same method as above is used. An increased volume of Ba results in a decreased crystallizability and an increased amorphous area and specific resistance. But no film separation has been observed.

Embodiment 3

An embodiment of a DRAM, which represents a semiconductor device incorporating the dielectric device produced in the First Embodiment of the present invention, will be described with reference to the cross sectional view of the DRAM cell in FIG. 3.

Device isolation oxide films 43a and 43b are produced on the P-type semiconductor 41 by an oxidation method, and N-type source/drain areas 40a, 40b and 40c are produced on the major surface of the semiconductor by ion implantation. Gate electrodes 42a, 42b, 42c and 42d having a film thickness of 200 nm are formed on the channel area between them through the gate oxides 41a, 41b, 41c and 41d having a film thickness of 12 nm. Electrically connected embedded bit line 44 is formed on the source/drain area 40b by photolithography and dry etching, and $SiO_2$ layer 14 is produced to cover the entire portion.

A dielectric device, comprising the glue layer 16, bottom electrode 17, dielectric film 18 and top electrode 19, is produced by the method described with reference to the First Embodiment. Then, after the interlayer insulation film 48 is formed so as to cover the top electrode 19, the surface is flattered by chemical etching. The first-layer aluminum wiring 45 is formed thereon at certain intervals, an insulation protective film 46 is produced so as to cover it, and the second-layer aluminum wiring 47 is formed thereon.

What is claimed is:

1. A concave semiconductor device incorporating a dielectric device having a dielectric disposed between a top electrode and a concave-shaped bottom electrode, said concave-shaped bottom electrode being enclosed by an insulation layer and provided along the inner side wall of a concave shaped hole in said insulation layer;

wherein said semiconductor device includes a glue layer provided between the inner side wall of the concave hole in the insulation layer and said bottom electrode, and said glue layer is composed of at least one of Ti, Ta, W and Cu, or a mixture of the oxide of at least one of Ti, Ta, W and Cu, and other metals.

2. A concave semiconductor device incorporating a dielectric device having a dielectric disposed between a top electrode and a concave-shaped bottom electrode, said concave-shaped bottom electrode being enclosed by an $SiO_2$ insulation layer and a TiN barrier layer covering a Si plug, and provided along said $SiO_2$ insulation layer and said TiN barrier layer;

wherein said semiconductor device includes a glue layer provided between the inner walls of said bottom electrode and said $SiO_2$ insulation layer, and said glue layer is composed of at least one of Ti, Ta, W and Cu, or a mixture of the oxide of at least one of Ti, Ta, W and Cu, and other metals.

3. A concave semiconductor device according to claim 1, wherein said glue layer includes a compound comprising at least one of $ARuO_3$ (where "A" is Ba, Sr, or coexistent Ba/Sr), $RuO_2$, and a mixture of Ru and $RuO_2$.

* * * * *